United States Patent [19]

Ramirez

[11] Patent Number: 5,760,612

[45] Date of Patent: Jun. 2, 1998

[54] INERTIAL DELAY CIRCUIT FOR ELIMINATING GLITCHES ON A SIGNAL LINE

[75] Inventor: Sergio R. Ramirez, Austin, Tex.

[73] Assignee: Advanced Micro Devices Inc., Sunnyvale, Calif.

[21] Appl. No.: 696,087

[22] Filed: Aug. 13, 1996

[51] Int. Cl.⁶ ........................................ H03K 9/08
[52] U.S. Cl. ................................. 327/34; 327/36
[58] Field of Search ...................... 327/15, 24–26, 327/31, 34–38, 165, 166, 170, 172, 173–176, 178, 263, 400, 18, 310, 551

[56] References Cited

U.S. PATENT DOCUMENTS

| | | | |
|---|---|---|---|
| 3,970,944 | 7/1976 | Huellwegen | 327/34 |
| 4,233,525 | 11/1980 | Takahashi et al. | 327/24 |
| 5,163,168 | 11/1992 | Hirano et al. | 327/176 |
| 5,184,032 | 2/1993 | Leach | 327/292 |
| 5,185,537 | 2/1993 | Creedon et al. | 327/34 |
| 5,440,178 | 8/1995 | McClure | 327/34 |
| 5,465,062 | 11/1995 | Fong | 327/176 |

Primary Examiner—Timothy P. Callahan
Assistant Examiner—My-Trang Nu Ton
Attorney, Agent, or Firm—Foley & Lardner

[57] ABSTRACT

An inertial delay circuit includes a negative glitch removing circuit connected in series with a positive glitch removing circuit. The negative and positive glitch removing circuits are respectively configured to pass only negative and positive pulses of an input signal having a pulse width greater than a pre-determined width. The negative glitch removing circuit passes its input through a delay line and performs a logical OR on its input and the delayed signal. The positive glitch removing circuit passes its input through a delay line and performs a logical AND on its input and the delayed signal. The glitch removing circuits may further include respective pulse width restoring circuits to restore the pulses passing therethrough to their original widths.

21 Claims, 10 Drawing Sheets

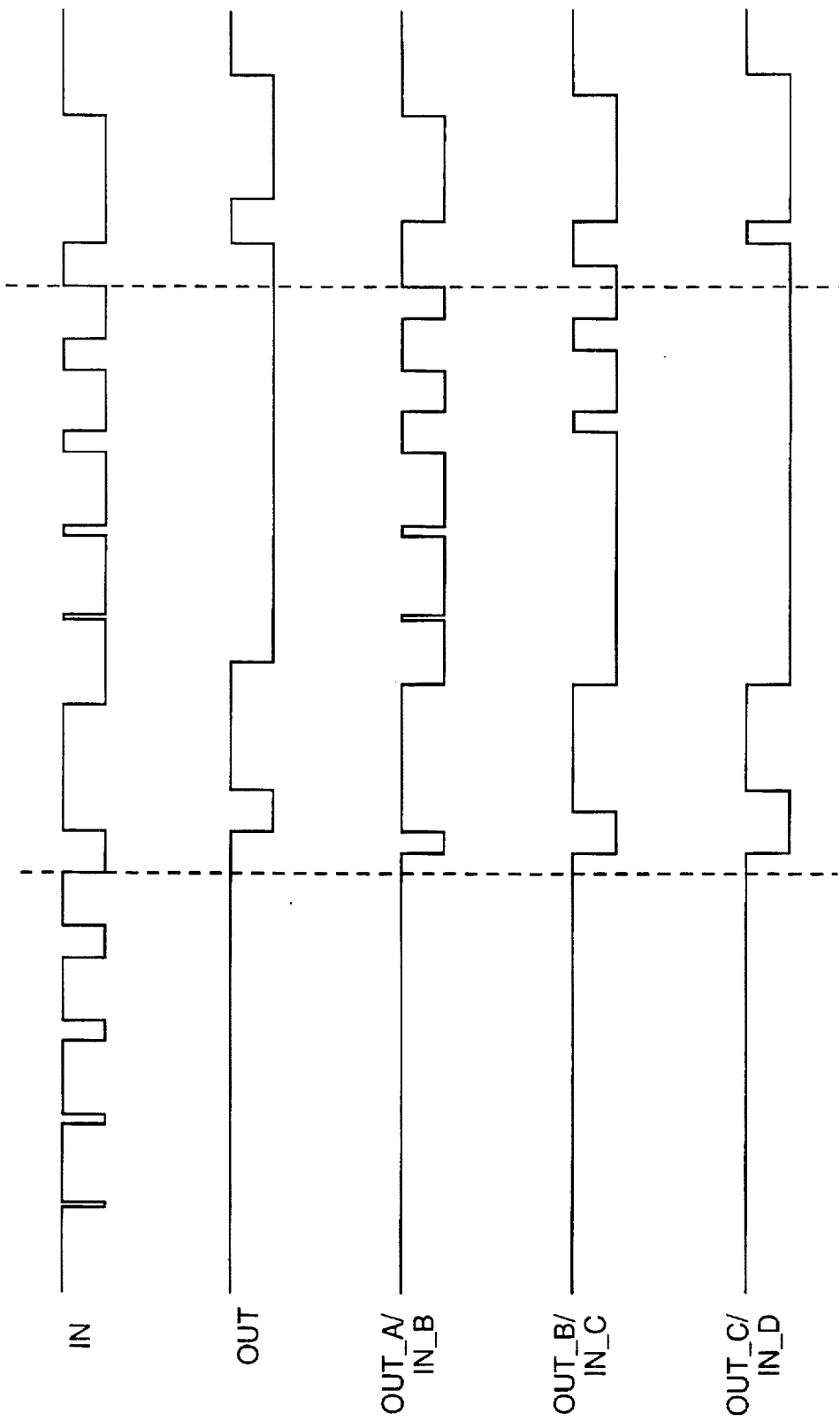

INERTIAL DELAY CIRCUIT FOR ELIMINATING GLITCHES ON A SIGNAL LINE

BACKGROUND OF THE INVENTION

1. Field of the Invention

The invention relates to delay circuits. More particularly the invention relates to delays circuits configured to remove glitches present on a signal.

2. Related Art

In digital systems, signals are transmitted at two voltage levels corresponding to a logical 0 (low) and logical 1 (high). A transition between a logical 1 and a logical 0 on a signal line causes a pulse on the signal line corresponding to the change in voltage levels. The duration in time between transitions is referred to as a pulse width.

Digital systems are also subject to noise, unsynchronized circuit operation, and other influences which cause transitions on the signal line. Unexpected transitions, also called glitches, may cause problems in circuit operation and may even render a system inoperable.

A glitch may correspond to a voltage spike (high or low) or to an unexpected transition from the current voltage level to the opposite level and back again. Glitches are typically characterized by their short duration. As used herein, a glitch is defined as any pulse present on a signal line having a pulse width less than a pre-determined width. For example, if a digital system is designed such that a signal line carries signals with pulses of at least N microseconds in width, any pulse having a width of less than N microseconds may be considered a glitch.

As an ideal, digital systems are designed to be glitch-free. In practice, however, glitches are difficult to eliminate. For example, FIG. 1a shows a conventional 2-1 multiplexer where a CONTROL signal selects between an INPUT_1 signal and an INPUT_2 signal for output on an OUTPUT signal. FIG. 1b shows a conventional logic gate implementation of the conventional 2-1 multiplexer from FIG. 1a. In the operation of the multiplexer, as shown in FIG. 1c, if both INPUT_1 and INPUT_2 are high, a transition in the CONTROL signal introduces a glitch on the OUTPUT signal.

FIG. 1d shows a conventional solution to avoiding this type of glitch wherein redundancy circuitry is added to eliminate the inadvertent output transition. However, as shown in FIG. 1e, if the input signals are not stable, the redundancy circuit cannot prevent the output signal from transitioning multiple times before becoming stable and glitches may still appear on the output line. Such a configuration cannot be guaranteed to be glitch-free.

Conventional solutions to the above problem require the use of clocked buffers to stabilize the control signals, the input signals, and/or the output signals. FIG. 1f shows a conventional solution wherein the output signal of the multiplexer is provided to a clocked buffer.

Summary of the Invention

It is an object of the invention to eliminate glitches on a signal line. It is a further object of the invention to eliminate glitches on a signal line without the use of a clock signal to debounce fast occurring glitches.

The above and other objects of the invention are achieved by an inertial delay circuit having an input and an output and being configured such that signal pulses on the input having a width smaller than or equal to a pre-determined width are not passed to the output. Signal pulses on the input having a width greater than the pre-determined width are passed to the output after a pre-determined delay.

BRIEF DESCRIPTION OF THE DRAWINGS

These and other objects and advantages of the invention will be apparent from a review of the specification in light of the drawings, wherein:

FIG. 14 shows an exemplary timing diagram for the second embodiment.

DESCRIPTION OF THE PREFERRED EMBODIMENTS

Logic gates, such as nand gates and inverters, are typically characterized by having a pre-determined rise time and fall time. Such devices are said to have "inertia" because a relatively long pulse activates the device (i.e., overcomes the inertia) and the pulse is acted on substantially as applied, in accordance with the logic of the device, and only delayed in accordance with the rise/fall time of the device. On the other hand, an extremely short pulse does not activate the device (i.e., does not overcome the inertia) and the pulse is not acted on by the device.

Figure 1A:
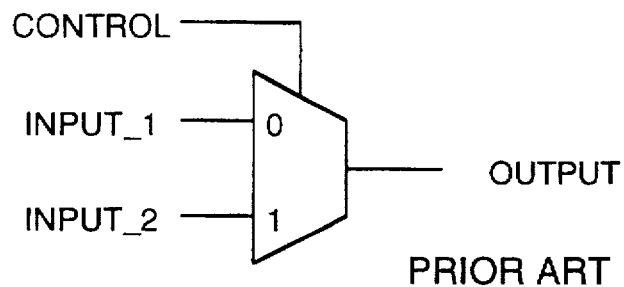
FIG. 1a through 1f show conventional circuits and corresponding timing diagrams which illustrate how glitches are introduced into digital signals and conventional solutions for removing the glitches.
Figure 1B:
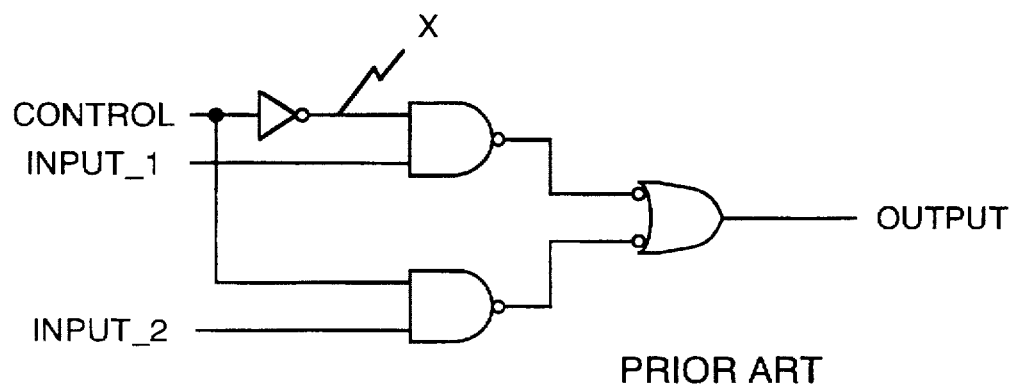
Figure 1C:
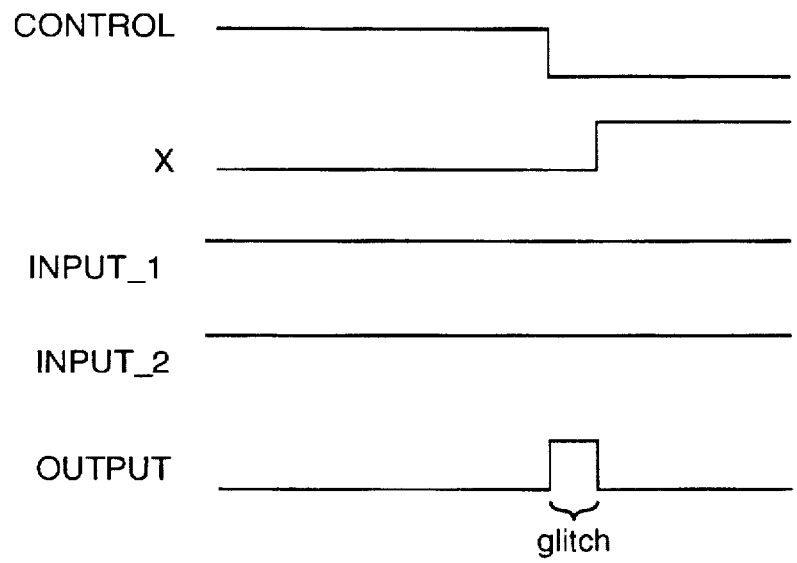
Figure 1D:
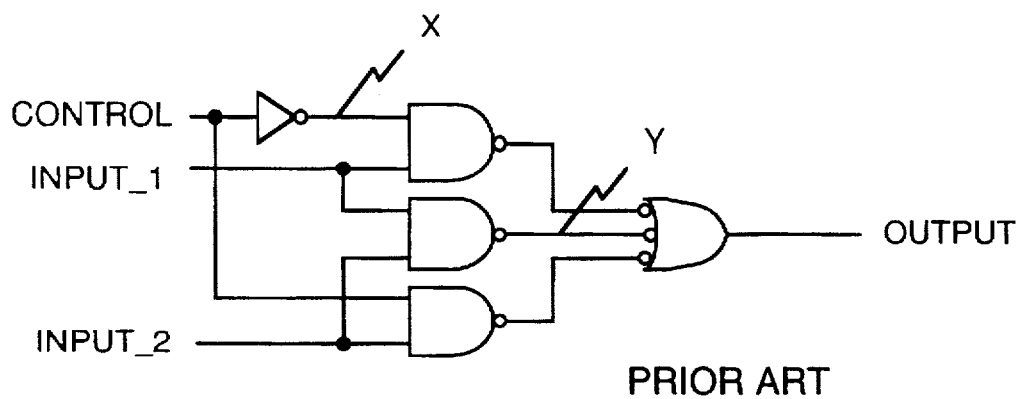
Figure 1E:
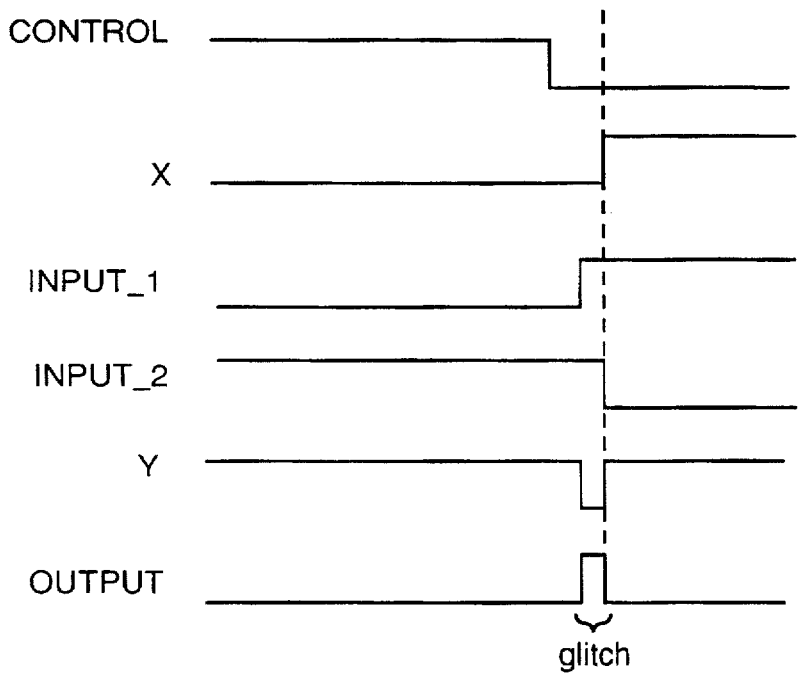
Figure 1F:
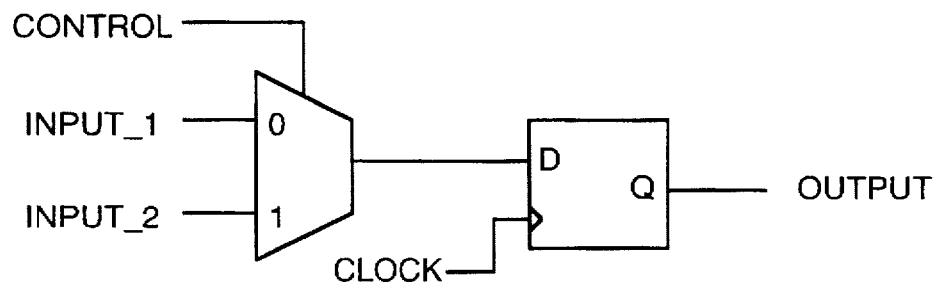
Figure 2:
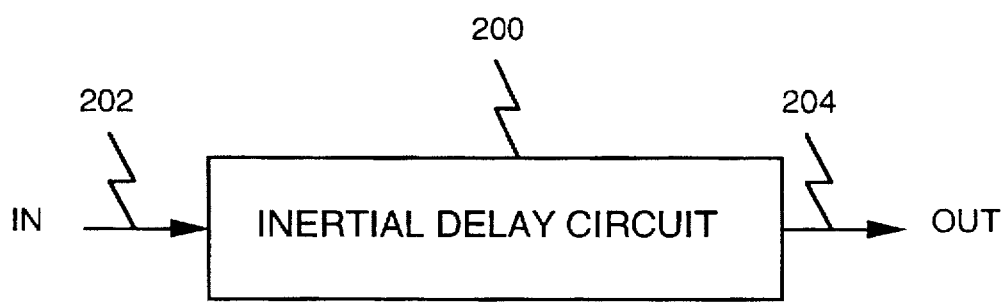
FIG. 2 shows a block diagram of a first embodiment of an inertial delay circuit according to the invention.

FIG. 2 shows a first embodiment of an inertial delay circuit according to the invention. An inertial delay circuit 200 receives an input signal 202 labelled IN and produces an output signal 204 labelled OUT. The inertial delay circuit 200 is configured to pass, with a pre-determined delay, only pulses of input signal 202 having a pulse width greater than a pre-determined width to output signal 204. In other words, input signals having a pulse width smaller than the pre-determined width are not present in the output signal 204. As defined above, the inertial delay circuit 200 may be said to have "inertia" because a pulse of sufficient width overcomes the inertia and is passed substantially as applied and only delayed by the pre-determined delay, while a pulse of insufficient width does not overcome the inertia and is not passed.

Figure 3:
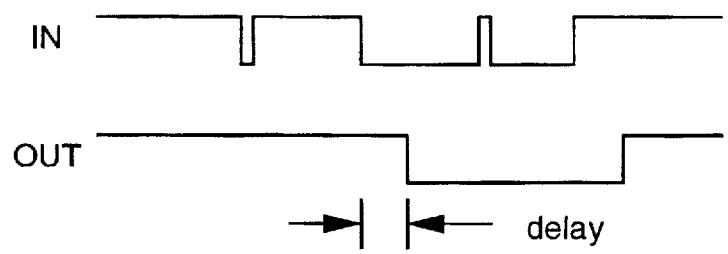
FIG. 3 shows an exemplary timing diagram for the first embodiment.

FIG. 3 shows an exemplary timing diagram with signals IN and OUT representing input signal 202 and output signal 204, respectively. As shown in FIG. 3, output signal 204 corresponds to input signal 202, after a pre-determined delay, with the undesired glitches removed. The pre-determined pulse width may correspond directly to the pre-determined delay of the inertial delay circuit 200.

Figure 4:
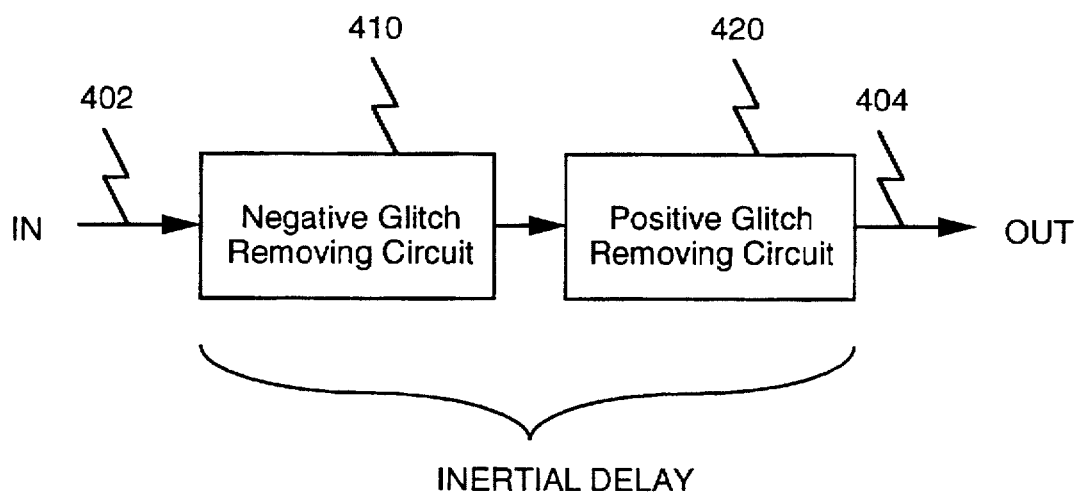
FIG. 4 shows a block diagram of a second embodiment of an inertial delay circuit according to the invention.

FIG. 4 shows a second embodiment of an inertial delay circuit according to the invention. Connected in series between input signal 402, labelled IN, and output signal 404, labelled OUT, are a negative glitch removing circuit 410 and a positive glitch removing circuit 420.

According to the invention, the position of the negative glitch removing circuit 410 and the positive glitch removing circuit 420 may be interchanged. In other words, the inertial delay circuit according to invention may be configured such that the positive glitch removing circuit 420 receives the input signal 402 and passes its output (free of positive glitches) to the negative glitch removing circuit 410, which provides the output signal 404 for the inertial delay circuit (free of negative and positive glitches).

Figure 5:
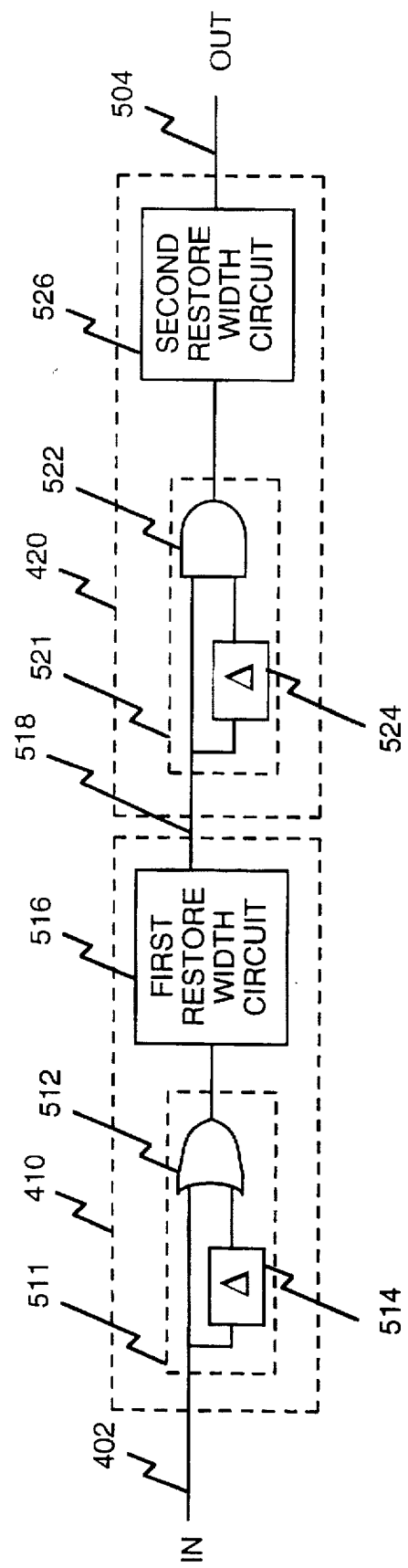
FIG. 5 shows a more detailed block diagram of the second embodiment.

FIG. 5 shows a more detailed block diagram of the second embodiment of an inertial delay circuit according to the invention. The negative glitch removing circuit 410 receives an input signal 402, labelled IN. The negative glitch removing circuit 410 includes a negative glitch filtering circuit 511 connected in series with a first restore width circuit 516. The negative glitch filtering circuit includes a logical OR gate 512 which receives the input signal 402 as a first input. The input signal 402 is also passed through a delay circuit 514 to a second input of the logical OR gate 512. The output of the logical OR gate 512 is provided to the first restore width circuit 516, described further herein, which restores the widths of pulses provided thereto for output with their original pulse widths from the input signal 402.

The positive glitch removing circuit 420 receives an intermediate signal 518 from the negative glitch removing circuit 410. The positive glitch removing circuit 420 includes a positive glitch filtering circuit 521 connected in series with a second restore width circuit 526. The positive glitch filtering circuit 521 includes a logical AND gate 522 which receives the intermediate signal 518 as a first input. The intermediate signal 518 is also passed through a delay circuit 524 to a second input of the logical AND gate 522. The output of the logical AND gate 522 is provided to a second restore width circuit 526, described further herein, which restores the widths of pulses provided thereto for output with their original pulse widths from the intermediate signal 518.

An operation of the circuit shown in FIG. 5 is as follows. Assuming a pre-determined delay of delay circuits 514 and 524 to be 10D (where D represents a unit of delay time; D may correspond, for example, to the delay time through a single inverter gate), negative pulses of less than or equal to 10D are removed. An 11D negative pulse passes through the first stage (comprised of the logical OR gate 512 and the delay circuit 514) of the negative glitch removing circuit 410 as a 1D negative pulse. The second stage (comprised of the first restore width circuit 516) of the negative glitch removing circuit 410 restores the negative pulse width to 11D which subsequently passes through the positive glitch removing circuit 420 as an 11D negative pulse. However, a positive pulse of less than 10D passes through the first stage as two positive pulses separated by a negative pulse. In this situation, the second stage merges the two positive pulses into a single positive pulse of less than 10D.

Positive pulses, appearing at the input of positive glitch removing circuit 420, of less than or equal to 10D are removed. An 11D positive pulse passes through the first stage (comprised of the logical AND gate 522 and the delay circuit 524) of the positive glitch removing circuit 420 as a 1D positive pulse. The second stage (comprised of the second restore width circuit 526) of the positive glitch removing circuit 420 restores the positive pulse width to 11D, which is subsequently output as output signal 504.

Figure 6:
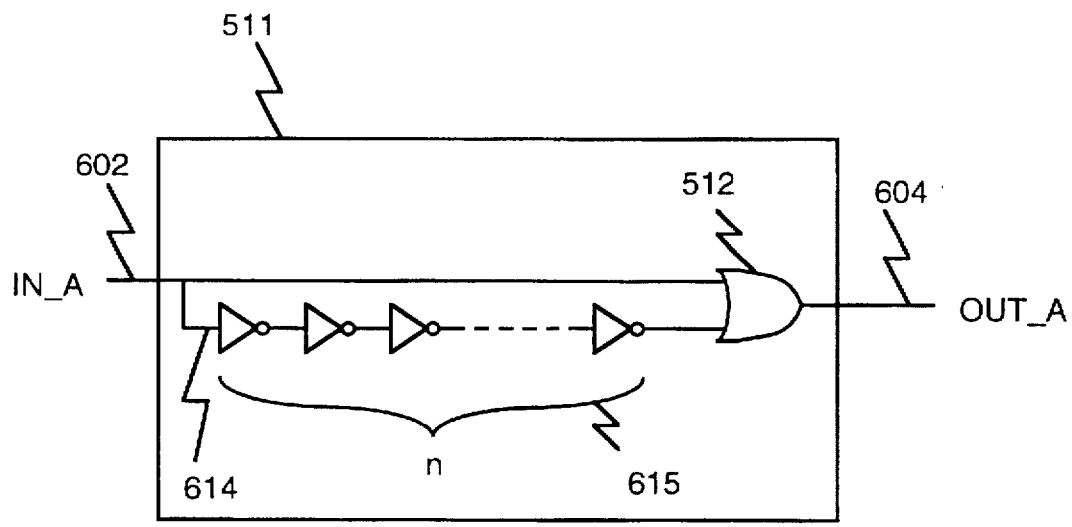
FIG. 6 shows an exemplary negative glitch filtering circuit according to the invention.

The negative glitch filtering circuit 511 may be configured, for example, as shown in FIG. 6. The negative glitch filtering circuit 511 has an input 602, labelled IN_A, and provides an output 604, labelled OUT_A. IN_A is connected to a first input of the OR gate 512 and to a delay line 614. Delay line 614 includes an even-numbered plurality of inverters 615. As shown in FIG. 6, an even number of inverters is used to maintain the original logic level of the signal. Alternatively, other appropriate logic may be used to provide the desired delay while maintaining the original logic level. The output of the delay line 614 is supplied to the second input of the OR gate 512. The output of the OR gate 512 is provided as the output 604 of the negative glitch filtering circuit 511.

Operation of the circuit shown in FIG. 6 is as follows. An input signal arrives on IN_A. The input signal is passed through the delay line 614 and is logically OR'ed with the present input signal. Operating in this manner, negative glitches present on the input signal are removed from the input signal.

For example, if the delay through each inverter 615 is D, the total delay through the delay line 614 is nD, where n is an integer representing the number of inverters. If a transition occurs on IN_A from a logical 1 to a logical 0 and back to logical 1, a negative pulse is carried through the delay line 614. When the negative pulse arrives at the output of the delay line 614, it is OR'ed with the present input signal. Considering the negative pulse width to be equal to T, if T<nD (the pre-determined delay through the delay line 614), then the delayed negative pulse, a logical 0, is OR'ed with a logical 1 (the present value of the input signal), and OUT_A remains a logical 1 with the negative pulse effectively removed.

Figure 7:
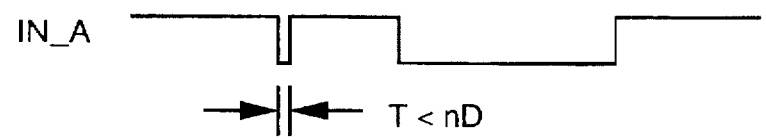
FIG. 7 shows an exemplary timing diagram for the circuit shown in FIG. 6.
Figure 7:
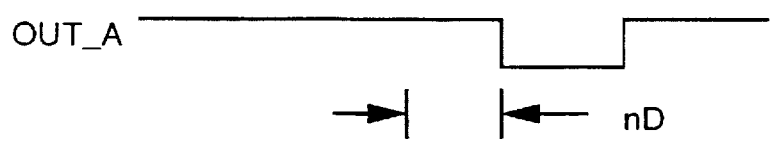

FIG. 7 shows a timing diagram with signals IN_A and OUT_A representing input 602 and output 604, respectively. As shown in FIG. 7, a negative glitch in signal IN_A, with a pulse width T <nD, is removed by negative glitch removing circuit 410 and is not present in the output signal OUT_A.

Figure 8:
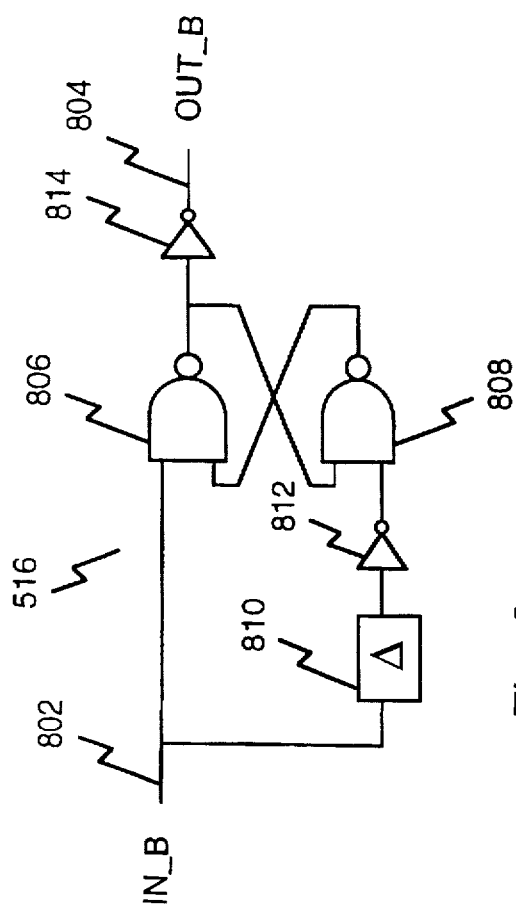
FIG. 8 shows an exemplary first restore width circuit according to the invention.

FIG. 8 shows an exemplary embodiment for the first restore width circuit 516. A pair of logical NAND gates 806 and 808 are configured with their respective outputs cross-coupled to a respective one of their inputs, thereby forming a latch circuit. An input signal 802, labelled "IN_B" and corresponding to the connection between the output of logical OR gate 512 and the input of first restore width circuit 516 from FIG. 5, is provided to an input of logical NAND gate 806. The input signal 802 is also provided to a delay circuit 810, the output of which is inverted by inverter gate 812 and thereafter provided to an input of logical NAND gate 808. The output of logical NAND gate 806 is inverted by inverter 814 and provided as an output signal 804, labelled "OUT_B".

Figure 9:
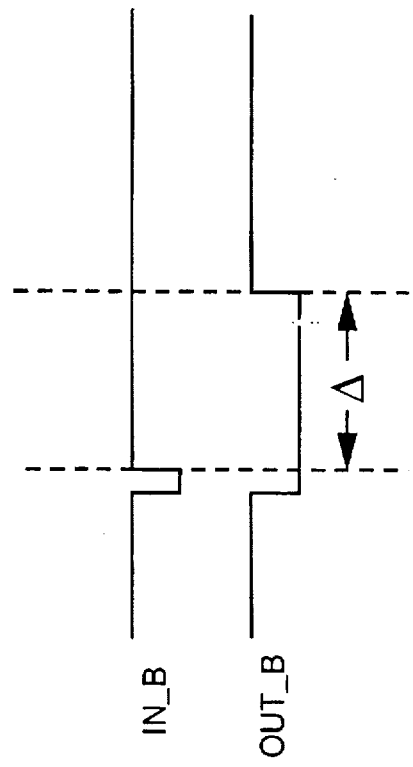
FIG. 9 shows an exemplary timing diagram for the circuit shown in FIG. 8.

FIG. 9 shows an exemplary timing diagram for the circuit shown in FIG. 8. The input signal IN_B is a 1D negative pulse (which corresponds to an original 11D pulse). The output signal OUT_B is restored to the original 11D pulse width.

Figure 10:
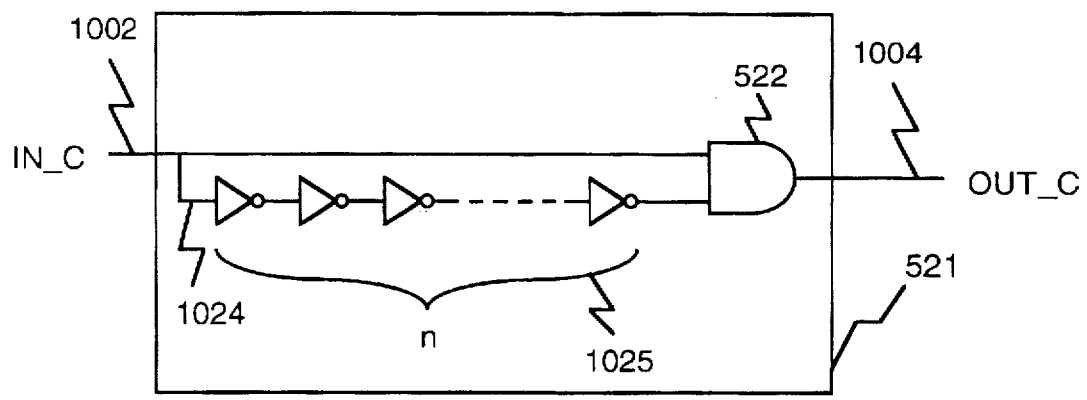
FIG. 10 shows an exemplary positive glitch filtering circuit according to the invention.

The positive glitch filtering circuit 521 may be configured, for example, as shown in FIG. 10. The positive glitch filtering circuit 521 has an input 1002, labelled IN_C, and provides an output 1004, labelled OUT_C. IN_C is connected to a first input of an AND gate 522 and to a delay line 1024. Delay line 1024 includes an even-numbered plurality of inverters 1025. As shown in FIG. 10, an even number of inverters is used to maintain the original logic level of the signal. Alternatively, other appropriate logic may be used to provide the desired delay while maintaining the original logic level. The output of the delay line 1024 is supplied to the second input of the AND gate 522. The output of the AND gate 522 is provided as the output 1004 of the positive glitch filtering circuit 521.

Operation of the circuit shown in FIG. 10 is as follows. An input signal arrives on IN_C. The input signal is passed through the delay line 1024 and is logically AND'ed with the present input signal. Operating in this manner, positive glitches present on the input signal are removed from the input signal.

For example, if the delay through each inverter 1025 is D, the total delay through the delay line 1024 is nD, where n is an integer representing the number of inverters. If a transition occurs on IN_C from a logical 0 to a logical 1 and back to logical 0, a positive pulse is carried through the delay line 1024. When the positive pulse arrives at the output of the delay line 1024, it is AND'ed with the present input signal. Considering the positive pulse width to be equal to T, if T<nD (the pre-determined delay through the delay line 1008), then the delayed positive pulse, a logical 1, is AND'ed with a logical 0 (the present value of the input signal), and OUT_C remains a logical 0 with the positive pulse effectively removed.

Figure 11:
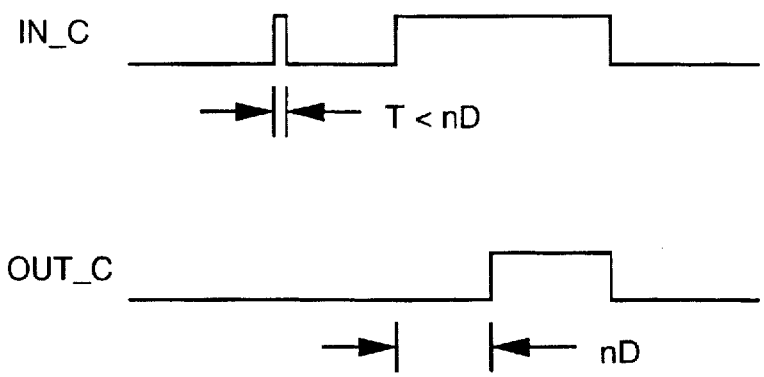
FIG. 11 shows an exemplary timing diagram for the circuit shown in FIG. 10.

FIG. 11 shows a timing diagram with signals IN_C and OUT_C representing input 1002 and output 1004, respectively. As shown in FIG. 11, a positive glitch in signal IN_C, with a pulse width T<nD, is removed by positive glitch filtering circuit 521 and is not present in the output signal OUT_C.

Figure 12:
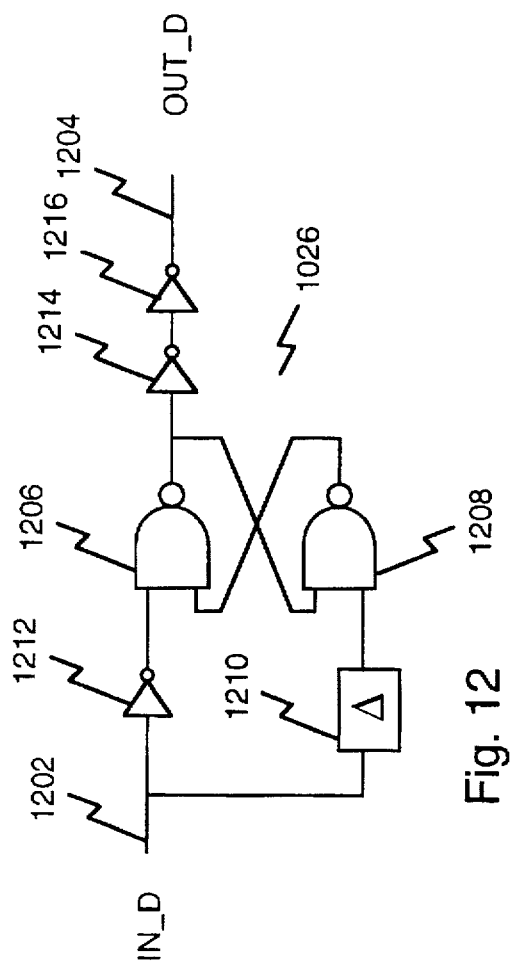
FIG. 12 shows an exemplary second restore width circuit according to the invention.

FIG. 12 shows an exemplary embodiment for the second restore width circuit 526. A pair of logical NAND gates 1206 and 1208 are configured with their respective outputs cross-coupled to a respective one of their inputs, thereby forming a latch circuit. An input signal 1202, labelled "IN_D" and corresponding to the connection between the output of logical AND gate 522 and the input of second restore width circuit 526 from FIG. 5, is inverted by inverter 1212 and thereafter provided to an input of logical NAND gate 1206. The input signal 1202 is also provided to a delay circuit 1210, the output of which is connected to an input of logical NAND gate 1208. The output of logical NAND gate 1206 is passed through a pair of inverters 1214 and 1216, the output of which is provided as an output signal 1204, labelled "OUT_D".

Figure 13:
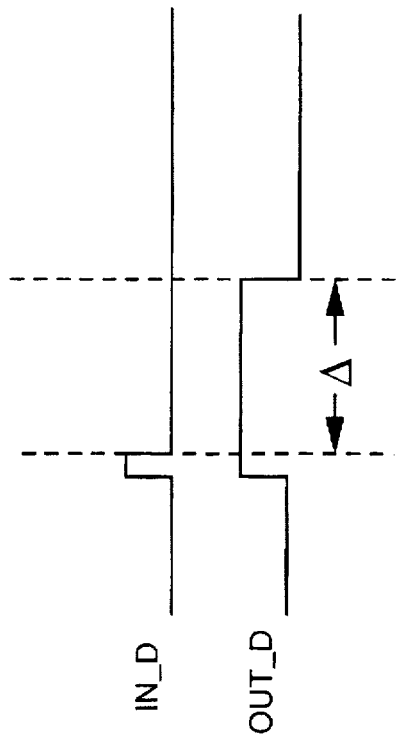
FIG. 13 shows an exemplary timing diagram for the circuit shown in FIG. 12.

FIG. 13 shows an exemplary timing diagram for the circuit shown in FIG. 12. The input signal IN_D is a 1D positive pulse (which corresponds to an original 11D pulse). The output signal OUT_D is restored to the original 11D pulse width.

FIG. 14 shows a timing diagram for the second embodiment of an inertial delay circuit according to the invention. Signals IN, OUT, OUT_A/IN_B, OUT_B/IN_C, and OUT_C/IN_D correspond to the similarly labelled connections from FIGS. 6, 8, 10, and 12. As shown in FIG. 14, signal IN has a pulse train with both positive and negative glitches of varying pulse widths. After passing through the first stage of the negative glitch removing circuit 410, signal OUT_A/IN_B has the negative glitches removed. After passing through the second stage of the negative glitch removing circuit, signal OUT_B/IN_C has the pulse widths restored to their original widths from signal IN. After passing through the first stage of the positive glitch removing circuit, signal OUT_C/IN_D has the positive glitches removed. After passing through the second stage of the positive glitch removing circuit, signal OUT corresponds to signal IN without the glitches present, with the pulse widths restored to their original widths from signal IN, and delayed by a pre-determined amount of time.

One skilled in the art will appreciate that other circuit elements may be used to implement the logic functions disclosed above. For example, the logical OR gate 512 of the negative glitch filtering circuit 511 may be implemented using a logical NOR gate serially connected with an inverter. Also, the logical AND gate 522 of the positive glitch filtering circuit 521 may be implemented using a logical NAND gate serially connected with an inverter.

Other embodiments of the invention will be apparent to those skilled in the art from consideration of the specification and practice of the invention disclosed herein. It is intended that the specification be considered as exemplary only, with the true scope and spirit of the invention being indicated by the following claims.

What is claimed is:

1. An inertial delay circuit comprising:
   an input signal line;
   an output signal line; and
   a delay circuit coupled between said input signal line and said output signal line, wherein said delay circuit prevents a first signal pulse present on said input signal line from passing to said output signal line, and wherein said delay circuit permits a second signal pulse present on said input signal line to pass to said output signal line delayed by a pre-determined delay,
   said first signal pulse having a pulse width smaller than or equal to a pre-determined width and said second signal pulse having a pulse width greater than said pre-determined width,
   wherein said delay circuit comprises:
   a negative glitch removing circuit; and
   a positive glitch removing circuit coupled in series with said negative glitch removing circuit.

2. An inertial delay circuit as recited in claim 1, wherein said negative glitch removing circuit comprises:
   a logical OR circuit having a first input, a second input, and an intermediate output signal line, said first input of said logical OR circuit being coupled to said input signal line; and
   a delay line circuit coupled between said input signal line and said second input of said logical OR circuit.

3. An inertial delay circuit as recited in claim 2, wherein said delay line circuit comprises a plurality of inverter circuits.

4. An inertial delay circuit as recited in claim 1, wherein said positive glitch removing circuit comprises:
   a logical AND circuit having a first input, a second input, and an output, said first input of said logical AND circuit being coupled to said intermediate output signal line, said output of said logical AND circuit being coupled to said output signal line; and a delay line circuit coupled between said intermediate output signal line and said second input of said logical AND circuit.

5. An inertial delay circuit as recited in claim 4, wherein said delay line circuit comprises a plurality of inverter circuits.

6. An inertial delay circuit comprising:

a negative glitch removing circuit; and a positive glitch removing circuit coupled in series with said negative glitch removing circuit, wherein one of said negative and positive glitch removing circuits is connected to receive an input signal, and an other of said negative and positive glitch removing circuits is connected to provide an output signal.

7. An inertial delay circuit as recited in claim 6, wherein said negative and positive glitch removing circuits are respectively configured to pass only negative and positive pulses of an input signal present on said input signal having a pulse width greater than a pre-determined width.

8. An inertial delay circuit as recited in claim 6, wherein said negative glitch removing circuit comprises:

a negative glitch filtering circuit having an input and an output; and a restore width circuit coupled to said output of said negative glitch filtering circuit.

9. An inertial delay circuit as recited in claim 8, wherein said negative glitch filtering circuit comprises a logical OR circuit having a first input, a second input, and an output, said first input being coupled to said input of said negative glitch filtering circuit and said output of said logical OR circuit providing said output of said negative glitch filtering circuit.

10. An inertial delay circuit as recited in claim 9, wherein said negative glitch filtering circuit further comprises a delay line circuit having an input coupled with said first input of said logical OR circuit and an output coupled to said second input of said logical OR circuit.

11. An inertial delay circuit as recited in claim 8, wherein said restore circuit comprises:

a latch circuit; and a delay line circuit coupled in series with an inverter circuit providing an input to said latch circuit.

12. An inertial delay circuit as recited in claim 11, wherein said latch circuit comprises:

a first logical NAND circuit; and a second logical NAND circuit cross-coupled with said first logical NAND circuit.

13. An inertial delay circuit as recited in claim 6, wherein said positive glitch removing circuit comprises:

a positive glitch filtering circuit having an input and an output; and a restore width circuit coupled to said output of said positive glitch filtering circuit.

14. An inertial delay circuit as recited in claim 13, wherein said positive glitch filtering circuit comprises a logical AND circuit having a first input, a second input, and an output, said first input being coupled to said input of said positive glitch filtering circuit and said output of said logical AND circuit providing said output of said positive glitch filtering circuit.

15. An inertial delay circuit as recited in claim 14, wherein said positive glitch filtering circuit further comprises a delay line circuit having an input coupled with said first input of said logical AND circuit and an output coupled to said second input of said logical AND circuit.

16. An inertial delay circuit as recited in claim 13, wherein said restore circuit comprises:

a latch circuit;

a delay line circuit having an input and an output; and an inverter circuit having an input and an output, said input of said inverter circuit being coupled with said input of said delay line circuit, said outputs of said inverter and delay line circuits providing respective inputs to said latch circuit.

17. An inertial delay circuit as recited in claim 16, wherein said latch circuit comprises:

a first logical NAND circuit; and second logical NAND circuit cross-coupled with said first logical NAND circuit.

18. A method of processing an input signal having pulses of a width less than a pre-determined width comprising the steps of:

(A) receiving said input signal;

(B) removing pulses having a pulse width less than or equal to said pre-determined width from said input signal; and (C) producing an output signal corresponding to said input signal with pulses of width less than or equal to said pre-determined width removed and delayed by a pre-determined delay, wherein step (B) comprises the steps of:

(a) producing a delayed signal by passing said input signal through a delay line; and (b) producing an intermediate signal by performing a logical OR on said input signal and said delayed signal.

19. The method as recited in claim 18, comprising the further step of:

(c) restoring a pulse width of said intermediate signal to an original width corresponding to a pulse width present on said input signal.

20. The method as recited in claim 18, wherein step (B) comprises the steps of:

(a) producing a delayed signal by passing said input signal through a delay line; and (b) producing an intermediate signal by performing a logical AND on said input signal and said delayed signal.

21. The method as recited in claim 20, comprising the further step of:

(c) restoring a pulse width of said intermediate signal to an original width corresponding to a pulse width present on said input signal.

* * * * *